United States Patent [19]

Bohnert et al.

[11] Patent Number: 4,939,447

[45] Date of Patent: Jul. 3, 1990

[54] FIBER-OPTIC VOLTAGE SENSOR

[75] Inventors: Klaus Bohnert, Niederrohrdorf; Rolf Kirchhofer, Mellingen, both of Switzerland

[73] Assignee: BBC Brown Boveri AG, Baden, Switzerland

[21] Appl. No.: 269,649

[22] Filed: Nov. 10, 1988

[30] Foreign Application Priority Data

Nov. 13, 1987 [CH] Switzerland .......................... 4432/87

[51] Int. Cl.$^5$ ............................................. G01R 19/00
[52] U.S. Cl. .................................. 324/96; 250/227.14; 324/72; 324/244
[58] Field of Search ........................... 324/72, 96, 244; 250/237; 332/7.51; 350/96.14

[56] References Cited

U.S. PATENT DOCUMENTS

| | | |
|---|---|---|
| 3,827,000 | 7/1974 | Matsushita et al. |
| 4,477,723 | 10/1984 | Carome et al. |
| 4,524,322 | 6/1985 | Bobb. |
| 4,564,289 | 1/1986 | Spillman, Jr. .......... 324/244 |
| 4,595,876 | 6/1986 | Kuhara et al. .......... 324/96 |
| 4,641,913 | 2/1987 | Nishiwaki et al. ........ 350/96.14 |
| 4,644,273 | 2/1987 | Bobb ...................... 324/96 |
| 4,724,316 | 2/1988 | Morton ................... 250/227 |

FOREIGN PATENT DOCUMENTS

1255940  9/1986  U.S.S.R. ........................ 324/96

OTHER PUBLICATIONS

Optics and Laser Technology, vol. 9, No. 6, Dec. 1977, pp. 273-283; A. J. Rogers.
Applied Optics, vol. 22, No. 7, Apr. 1, 1983, pp. 1006-1009; M. D. Mermelstein.
IEEE Journal of Quantum Electronics, vol. QE-18, No. 10, Oct. 1982, pp. 1624-1633; T. Yoshino, et al.

*Primary Examiner*—Reinhard J. Eisenzopf
*Assistant Examiner*—W. Burns
*Attorney, Agent, or Firm*—Oblon, Spivak, McClelland, Maier & Neustadt

[57] ABSTRACT

A fiber-optic voltage sensor comprises at least one fiber-optic, piezoelectric sensor element (2a, 2b, 2c, 2d), which measures a predeterminable directional component of a local electric field. One or more than one piezoelectric sensor elements (2a, 2b, 2c, 2d) are arranged serially between two ends of the fiber-optic voltage sensor, each piezoelectric sensor element (2a, 2b, 2c, 2d) respectively measuring a directional component of a local electric field, which component lies parallel to a path element assigned to it, the path elements as a whole forming an open polygon connecting the two ends of the fiber-optic voltage sensor. Each sensor element (2a, 2b, 2c, 2d) has a gain which is proportional to a length of the path element assigned to it. In a preferred embodiment, the piezoelectric sensor elements (2a, 2b, 2c, 2d) are connected by spacers (3a, 3b, 3c).

Preferably, the piezoelectric sensor elements (2a, 2b, 2c, 2d) are disc-shaped and the spacer (3a, 3b, 3c) are cylindrical and form as a whole a cylindrical body.

9 Claims, 1 Drawing Sheet

FIBER-OPTIC VOLTAGE SENSOR

FIELD OF THE INVENTION

The invention relates to a fiber-optic voltage sensor, comprising at least one fiber-optic, piezoelectric sensor element, which measures a predeterminable directional component of a local electric field.

DISCUSSION OF BACKGROUND

Fiber-optic sensors have been making ground of late in all areas of metrology. The reason for this is the low interference susceptibility of such sensors, especially with regard to electric and magnetic interference fields. Since it is now also possible to obtain the required optical components (optical fibers, lasers, photodiodes, etc.) with high quality at competitive prices, fiber-optic sensors have also become interesting from an economic point of view. Preference is given to piezoelectric sensor elements for the measurement of electric field strengths and potential differences. Such piezoelectric sensor elements employ the inverse piezo effect, in order to produce a change in length of an optical fiber which is proportional to the electric field strength. This change in length is then measured in an interferometric fashion.

In the publication "Optical-fiber copolymer-film electric-field-sensor", M. D. Mermelstein, Appl. Optics 22, 1006 (1983), an optical fiber is embedded in a body of PVDF (polyvinylidene fluoride). The whole is brought into an electric field, and a change in length of the optical fiber, which is proportional to the electric field strength, is measured with a Mach-Zehnder interferometer. With a given geometric arrangement, i.e. with a given field distribution, it is also possible, e.g., to measure a potential difference, since, in this case, the potential difference, e.g. between two plates of a capacitor, is directly connected to an ideal electric field strength at a given location in space.

In the publication "Fiber-optic Fabry-Perot interferometer and its Sensor Applications", T. Yoshino et al., IEEE J. of Quant. Elektr. QE-18, 1624 (1983), a voltage is measured in the manner that a fiber-optic Fabry-Perot interferometer is wound around a disc-shaped piezoelectric ceramic (PZT), a voltage is applied to the PZT, and the transmission (respectively reflection) of the fiber-optic Fabry-Perot interferometer is evaluated.

Finally, a piezoelectric sensor element is disclosed in the commonly owned Swiss patent application CH 4322/87 which corresponds to pending U.S. patent application Ser. No. 07/267,299 filed Nov. 4, 1988. Using such a sensor, it is possible to measure a specific, but freely predeterminable directional component of a local electric field. With this sensor, too, it is possible to determine a potential difference for a given field distribution.

It can be said in summary that it is possible to determine a potential difference with the known piezoelectric sensor elements for a given field distribution (electrode, conductors, insulators) through the measurement of an electric field strength. However, the fundamental disadvantage of such a measurement method lies in that it is suitable only for a fixed arrangement which does not change. In other words, the measurement arrangement must be newly calibrated for each new field distribution.

SUMMARY OF THE INVENTION

Accordingly, one object of this invention is to provide a novel fiber-optic voltage sensor, comprising at least one fiber-optic, piezoelectric sensor element, which measures a predeterminable directional component of a local electric field, with which it is possible to measure a potential difference between two freely selectable space points independently of a specific field distribution.

The object is achieved according to the invention in that one or more than one piezoelectric sensor elements are arranged serially between two ends of the fiber-optic voltage sensor, in that each piezoelectric sensor element respectively measures a directional component of a local electric field, which component lies parallel to a path element assigned to it, the path elements as a whole forming a path of integration connecting the two ends of the fiber-optic voltage sensor, and in that each sensor element has a gain which is proportional to a length of the path element assigned to it.

If all path elements $s_i$ have the same length, the piezoelectric sensor elements can be identical. This corresponds to an especially advantageous embodiment of the invention.

Preferred embodiments of the invention follow from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
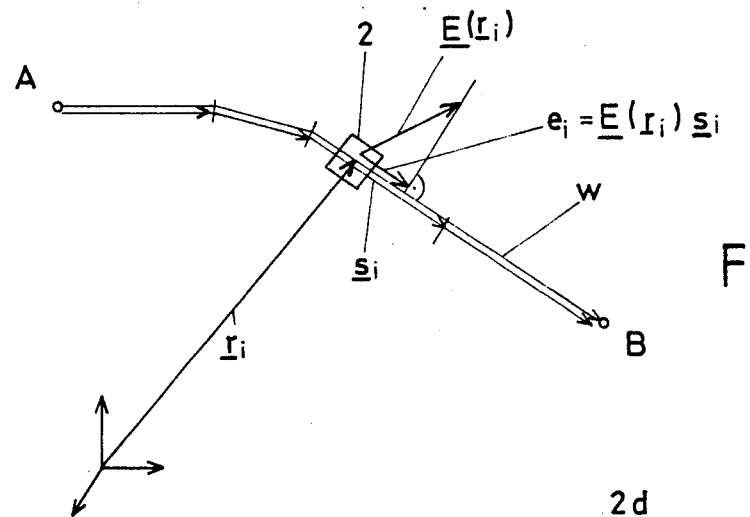
FIG. 1 shows a representation of the principle of the fiber-optic voltage sensor according to the invention.

Referring now to the drawings, wherein like reference numerals designate identical or corresponding parts throughout the several views, in FIG. 1 there is a representation of the principle on which the invention is based.

It is known that in a position-dependent electric field distribution E(r), where r denotes a position vector, a potential difference V between two space points A,B is given by a line integral L $$V = L = \int_w E(r)dw \qquad (I)$$

along a path of integration w connecting the two space points A,B. The substance of the invention now resides in selecting the path of integration w as open polygon, consisting of a given number n of path elements $s_i$ (i=1 ... n), and in assuming that the electric field distribution E(r) along each one of the path elements $s_i$ is constant in magnitude and direction, so that the line integral L can be approximated by a sum S:

$$L \approx S = \sum_{i=1}^{n} E(r_i)s_i \quad \text{(II)}$$

A support location $r_i$ is established on each path element $s_i$. A piezoelectric sensor element 2 is arranged at each support location $r_i$, and determines a summand $e_i$ as scalar product of a local field strength $E(r_i)$ and the corresponding path element $s_i$.

The sensor element (2) must be aligned so that it measures a directional component of the local field strength $E(r_i)$, which lies parallel to the path element $s_i$ assigned to it. Moreover, it must have a gain, which is proportional to a length of the path element $s_i$ assigned to it.

The gain of a fiber-optic, piezoelectric sensor element is understood to be a change in the length of an optical fiber, which is caused by a given local field strength. I.e., for a given local field strength, a piezoelectric sensor element having a large gain produces a large change in the length of the optical fiber.

The fiber-optic voltage sensor determines the potential differential V only approximately. Its accuracy of measurement depends essentially on how rapid is the change in the field distribution E(r) as to magnitude and and direction (in relation to the path of integration w) from one support location $r_i$ to the next $r_{i+1}$. The slower the change in the electric field of distribution E(r), the higher the accuracy of measurement.

In practice, the path of integration w will mostly be a more or less straight line, which means that the electric field distribution E(r) is to change slowly by comparison with the distance between two neighboring support locations $r_i$, $r_{i+1}$, or in comparison with the length of the path elements $s_i$.

Figure 2:
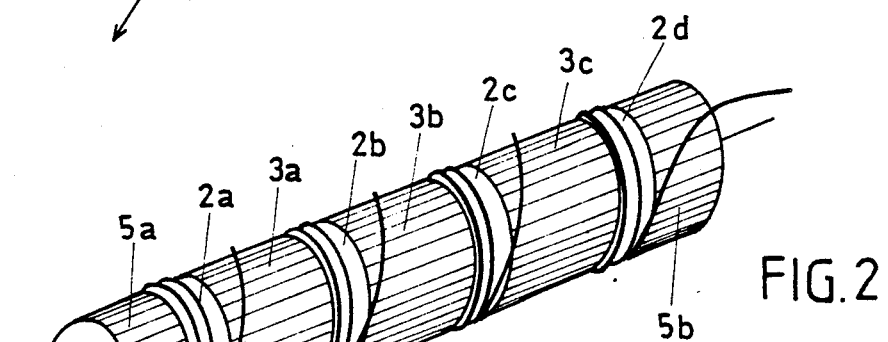
FIG. 2 shows a fiber-optic voltage sensor having disc-shaped, piezoelectric sensor elements.

FIG. 2 shows a first embodiment of the invention, in which the fiber-optic voltage sensor has a cylindrical body. It comprises an optical fiber 1, four direction-sensitive piezoelectric sensor elements 2a, 2b, 2c, 2d, three spacers 3a, 3b, 3c and two end pieces 5a, 5b.

The four piezoelectric sensor elements 2a, 2b, 2c, 2d are identical in this embodiment. They correspond, e.g., to an embodiment described in the copending commonly owned U.S. application Ser. No. 07/267,299 above noted. They have the form of a disc, and consist, e.g., of PVDF (polyvinylidene fluoride), which is electrically polarized in a cristallographic Z-direction and mechanically stretched in a cristallographic Y-direction. A cristallographic Z-direction lies parallel to a disc normal. X-direction and Y-direction both lie at right angles thereto, and therefore at right angles to an axis a of the cylindrical body.

Located in each case between two respective discs of PVDF is a spacer 3a, 3b, 3c. The optical fiber 1 is wound around this cylindrical body, it being necessary for each disc to have the same number of windings. In this embodiment, the fiber is fed twice around each disc, in each case. The two end pieces respectively form the termination of the cylindrical body, since the number of the windings stipulates the gain of the piezoelectric sensor elements 2a, 2b, 2c, 2d.

Each piezoelectric sensor element 2a, 2b, 2c, 2d measures a directional component of the electric field, which lies parallel to the disc normal, and thus parallel to the axis a. Clearly, axis a represents the path of integration w. The two space points A, B of FIG. 1 correspond to the two end faces of the cylindrical body or, putting it precisely, to the points where the axis a emerges from the end faces. The end pieces 5a, 5b are there purely and simply to define the path of integration precisely. Accordingly, they must be half as long as the spacers 3a, 3b, 3c.

In this embodiment, the spacers 3a, 3b, 3c are all of the same length, and made of a non-piezoelectric material, e.g. of non-electrically polarized PVDF, or of nylon. It is important, namely, that the spacers 3a, 3b, 3c do not produce a change in the length of the optical fiber 1, as do the piezoelectric sensor elements 2a, 2b, 2c, 2d through the electric field distribution E(r) which is to be measured and integrated. The length of the spacers 3a, 3b, 3c is to be selected so that the desired accuracy of measurement can be attained.

In a preferred embodiment of the invention, the disc-shaped piezoelectric sensor elements are arranged on a common axis directly next to one another without any spacers. In this so-called quasi-continuous case, it is necessary for an optical fiber to be wound with a constant number of windings per length of the cylindrical body. A magnitude corresponding to the path element $s_i$, and thus to the gain, is then the distance between two neighboring windings of the optical fiber. Whether the cylindrical body is composed of more than one piezoelectric discs, or whether it consists of a single coherent material, is determined by technological considerations alone, and of no importance for the invention.

The piezoelectric sensor elements 2a, 2b, 2c, 2d and the spacers 3a, 3b, 3c are to be assembled in such a way that they do not interfere with one another as to their appropriate function. They can, e.g., be provided with a borehole and strung up on a spindle, where they can be jammed between two nuts.

For certain applications, it can be an advantage if the fiber-optic voltage sensor is capable of being bent along its axis a. In such cases, the spacers 3a, 3b, 3c are preferably constructed to be mechanically flexible. They can be either elastically or plastically deformable, but may not substantially change in length. Likewise, the direction of the disc normal should not change too greatly from one piezoelectric sensor element to the next.

It is known that through the inverse piezoelectric effect the length of the optical fiber 1 is changed by means of the piezoelectric discs, namely proportional to the directional component of the local field strength $E(r_i)$ lying parallel to the axis a. The total change in the length of the glass fiber 1 is proportional to the voltage, which prevails between the ends of the fiber-optic voltage sensor, i.e. between the two space points A, B. It can be measured, e.g., with a Mach-Zehnder interferometer. The optical fiber 1 then forms an arm of the Mach-Zehnder interferometer. Details on this preferred arrangement can be taken from the already cited Swiss patent application CH 4322/87, or from the publication of M. D. Mermelstein mentioned at the beginning.

It goes without saying that the invention is not restricted to fiber-optic voltage sensors having four piezoelectric sensor elements. Rather, the number of the piezoelectric sensor elements is to be adapted to the particular requirements. No further explanations are required as to how the embodiment just described of the invention can be extended to fiber-optic voltage sensors having an arbitrarily selected number of piezoelectric sensor elements.

If the individual path elements $s_i$ do not all have the same length, then the piezoelectric sensor elements must also have different gains. As already mentioned, the gain of a piezoelectric sensor element must be selected in accordance with the length of the path element $s_i$ assigned to it. In the example described, where the individual piezoelectric sensor elements 2a, 2b, 2c, 2d, i.e. the discs, all have the same body dimensions, the gain is given by the number of windings per disc. A piezoelectric sensor element, the path element $s_i$, of which is, e.g., twice as long as a neighbouring one, must therefore have a number of windings twice as great as the neighboring one. In this case, the ratio of the numbers of windings is to be laid down in accordance with the ratio of the lengths of the assigned path elements $s_i$.

However, it is also conceivable to predetermine the gain by other quantities such as, e.g., the radius of the disc.

Figure 3:
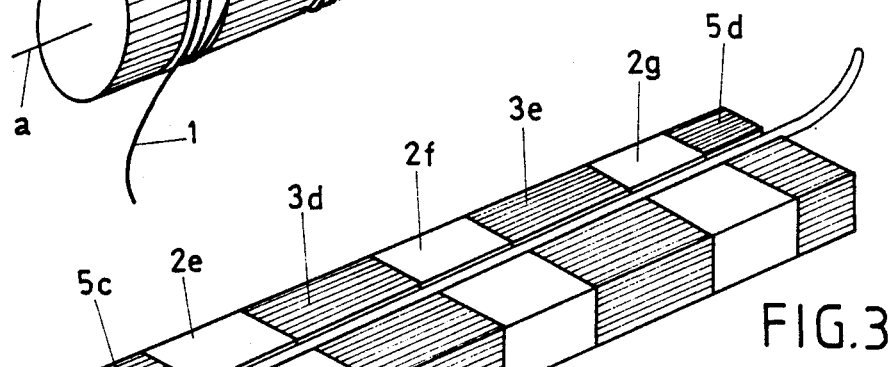
FIG. 3 shows a fiber-optic voltage sensor having plate-shaped, piezoelectric sensor elements, which measure a directional component of a local field strength lying parallel to a respective longitudinal plate direction.

FIG. 3 shows a fiber-optic voltage sensor having plate-shaped, piezoelectric sensor elements. In this second illustrative embodiment, the fiber-optic voltage sensor comprises, in a manner similar to FIG. 2, an optical fiber 1, three identical, piezoelectric sensor elements 2e, 2f, 2g, two end pieces 5c, 5d, and two spacers 3d, 3e. By contrast with the first illustrative embodiment, the piezoelectric sensor elements 2e, 2f, 2g have the form of a plate. The optical fiber 1 is mounted in a longitudinal plate direction on a principal face of the plate. A cristallographic orientation of the piezoelectric material of the plate is selected so that a directional component of the local field strength is measured, which lies parallel to a longitudinal plate direction, and thus parallel to the optical fiber 1.

If the piezoelectric sensor element 2e, 2f, 2g, i.e. the plate, consists of $\alpha$-quartz, for example, then a cristallographic X-direction must lie parallel to the optical fiber 1. The orientation of a cristallographic Y-direction and Z-direction is arbitrary. This example represents only one of many possibilities of designing a piezoelectric sensor element 2e, 2f, 2g. For a detailed summary of all possibilities, reference is made once again to the commonly owned U.S. application Ser. No. 07/267,299.

Concerning the spacers 3d, 3e and the end pieces 5c, 5d it is possible to say the same as in the illustrative embodiment according to FIG. 2. In particular, they are all to consist of a non-piezoelectric material. The two end pieces 5c, 5d are half as long as the spacers 3d, 3e. The reason for this is that the piezoelectric sensor elements 2e, 2f, 2g are identical, or, in other words, that the path elements $s_i$ are all of the same length.

An extension of the described embodiment to a fiber-optic voltage sensor having an arbitrarily selected number of piezoelectric sensor elements is not opposed by any difficulties. In this example, the gain of a piezoelectric sensor element 2e, 2f, 2g is determined by a length of the plate. The length of the plate is, therefore, to be selected in relation to the length of the path element $s_i$ assigned to the corresponding piezoelectric sensor element 2e, 2f, 2g.

The spacers 3d, 3e are not essential. Basically, it is sufficient to attach a plurality of piezoelectric sensor elements at given intervals to an optical fiber 1. It is then, however, to be observed that direction and spacing of the piezoelectric sensor elements in space are such that the approximation of the line integral L is still informative. In practice, this will amount to keeping the optical fiber 1 stretched. The path of integration w then coincides with the optical fiber 1.

Here, too, it is to be pointed out that it is possible for the piezoelectric sensor elements to be directly abutted, in a fashion similar to the already described so-called quasi-continuous case of the cylindrical fiber-optic voltage sensor.

Figure 4:
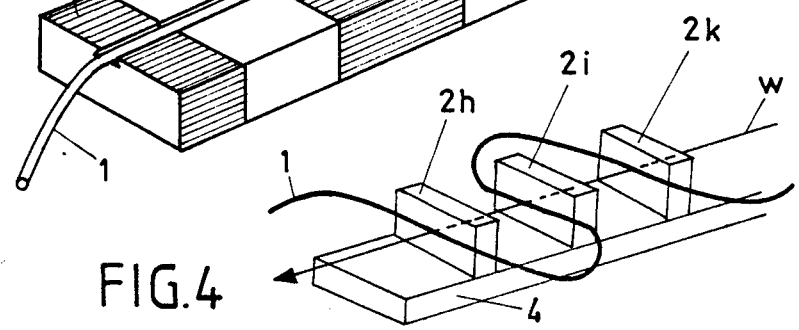
FIG. 4 shows a fiber-optic voltage sensor having plate-shaped, piezoelectric sensor elements, which measure a directional component of a local field strength lying parallel to a respective plate normal.

FIG. 4 shows a further embodiment of the invention. It comprises an optical fiber 1, piezoelectric sensor elements 2h, 2i, 2k, and a carrier 4. Once again, the piezoelectric sensor elements 2h, 2i, 2k have the form of a plate. A cristallographic orientation is, however, selected so that a directional component of a local field strength $E(r_i)$ is measured which lies parallel to a respective plate normal. In FIG. 4, the path of integration w is also represented. For each plate it extends parallel to the respective plate normal.

By way of example, we shall once again choose one variant of a piezoelectric sensor element from the wealth of variants described in the already mentioned commonly owned U.S. patent application Ser. No. 07/267,299. If, for example, the plate sists of a piezoelectric ceramic (PZT), then a cristallographic Z-direction must lie parallel to the plate normal. The orientation of cristallographic X-direction and Z-direction is arbitrary.

The piezoelectric sensor elements 2h, 2i, 2k are mounted at equal distance from each other on the carrier 4 in accordance with a preferred embodiment of the invention. Since the carrier 4 really has the same function as the spacers in the illustrative embodiments described above, it, too, ought to consist of a non-piezoelectric material. Since the optical fiber 1 has no loops between the individual piezoelectric sensor elements, mechanical deformations of the carrier 4 cannot cause the length of the optical fiber to change. In this illustrative embodiment, the carrier 4 consists advantageously of an elastically deformable material.

In the illustrative embodiments according to FIG. 3 or FIG. 4, the optical fiber 1 can, e.g., be mounted on the plate in such a way that it is encapsulated with an adhesive in a groove located on a principal face of the plate.

The features of the invention, and its preferred embodiments, point far beyond the three illustrative embodiments described. The U.S. patent application Ser. No. 07/267,299, already cited more than once, discloses the characteristics of piezoelectric sensor elements in a fundamental way. All illustrative embodiments described there can be applied to the present invention. In particular, it emerges that the materials given by way of example such as PVDF, lithiumniobate (LiNbO$_3$), PZT and $\alpha$-Quartz can be applied for all three illustrative embodiments described.

In an embodiment according to FIG. 3, a joint carrier (see FIG. 4) can take over the function of the spacer 3d, 3e. Conversely, in an embodiment according to FIG. 4, the carrier 4 can be replaced by individual spacers (see FIGS. 2 and 3).

In principle, a change in the length of the optical fiber 1 can be established with any interferometric measurement procedure. Apart from measurement with a Mach-Zehnder interferometer, measurement with a fiber-optic Fabry-Perot interferometer is also particularly suitable.

It may be said in conclusion that a fiber-optic voltage sensor for measuring potential differences has been created with the invention, which is versatile in application, simple to use and insensitive to interferences.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. Fiber optic voltage sensor comprising:
   plural fiber-optic, piezoelectric sensor elements which measure exclusively one predeterminable directional component of a local electric field strength;
   the piezoelectric sensor elements arranged on a common axis and are all connected serially to one fiber, each piezoelectric sensor element respectively measuring a directional component of the local field strength, which field component lies parallel to a path element assigned to the sensor element, all path elements together forming a path of integration which is represented by the common axis; and
   each sensor element having a gain which is proportional to a length of the path element assigned to it.

2. Fiber optic voltage sensor comprising:
   plural fiber-optic, piezoelectric sensor elements which measure exclusively one predeterminable directional component of a local electric field strength;
   the piezoelectric sensor elements arranged on a common axis and connected serially to one fiber, the piezoelectric sensor elements connected by non-piezoelectric spacers arranged on the common axis, each piezoelectric sensor element respectively measuring a directional component of the local field strength, which field component lies parallel to a path element assigned to the sensor element, all path elements together forming a path of integration which is represented by the common axis; and
   each sensor element having a gain which is proportional to a length of the path element assigned to it.

3. Fiber optic voltage sensor comprising:
   plural fiber-optic, piezoelectric sensor elements which measure exclusively one predeterminable directional component of a local electric field strength;
   the piezoelectric sensor elements being disc shaped and a fiber being wound around the edge of the discs, such that in each case a directional component is measured which lies parallel to the disc normal;
   the piezoelectric sensor elements arranged on a common axis and connected serially to one fiber, forming by that a cylindrical body, each piezoelectric sensor element respectively measuring a directional component of the local field strength, which field component lies parallel to a path element assigned to the sensor element, all path elements together forming a path of integration which is represented by the common axis; and
   each sensor element having a gain which is proportional to a length of the path element assigned to it.

4. Fiber optic voltage sensor comprising:
   plural fiber-optic, piezoelectric sensor elements which measure exclusively one predeterminable directional component of a local electric field strength;
   the piezoelectric sensor elements being plate shaped and measuring a directional component of the local electric field strength which lies parallel to the longitudinal plate direction, a fiber being fixed on the piezoelectric sensor elements in the longitudinal plate direction;
   the piezoelectric sensor elements arranged on a common axis and connected serially to one fiber, each piezoelectric sensor element respectively measuring a directional component of the local field strength, which field component lies parallel to a path element assigned to the sensor element, all path elements together forming a path of integration which is represented by the common axis; and
   each sensor element having a gain which is proportional to a length of the path element assigned to it.

5. Fiber optic voltage sensor as claimed in claim 1, 2, 3 or 4, wherein the individual path elements of the path of integration are of the same length.

6. Fiber optic voltage sensor as claimed in claim 1, wherein the piezoelectric sensor elements are plate-shaped and measure a directional component of the local field strength which lies parallel to a respective plate normal.

7. Fiber optic voltage sensor as claimed in claim 2, wherein the spacers are mechanically flexible.

8. Fiber optic voltage sensor as claimed in claim 6, wherein the piezoelectric sensor elements are arranged on a common non-piezoelectric carrier.

9. Fiber optic voltage sensor as claimed in claim 1, wherein the piezoelectric sensor elements are abutted without any spacers.

* * * * *